(12) United States Patent
Maeda et al.

(10) Patent No.: US 8,367,530 B2
(45) Date of Patent: Feb. 5, 2013

(54) SUBSTRATE PROCESSING APPARATUS AND MANUFACTURING METHOD OF SEMICONDUCTOR DEVICE

(75) Inventors: Kiyohiko Maeda, Imizu (JP); Takeo Hanashima, Toyama (JP); Masanao Osanai, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 454 days.

(21) Appl. No.: 12/659,999

(22) Filed: Mar. 26, 2010

(65) Prior Publication Data

US 2010/0190355 A1 Jul. 29, 2010

Related U.S. Application Data

(62) Division of application No. 12/226,323, filed as application No. PCT/JP2007/065616 on Aug. 9, 2007, now Pat. No. 7,795,143.

(30) Foreign Application Priority Data

Aug. 11, 2006 (JP) ................................. 2006-219677

(51) Int. Cl.
*H01L 21/26* (2006.01)
*H01L 21/42* (2006.01)

(52) U.S. Cl. .................. 438/513; 438/700; 257/E21.17; 257/E21.269; 257/E21.274; 257/E21.311

(58) Field of Classification Search ................... 257/513, 257/700, 905, E21.17, E21.269, E21.274, 257/E21.311

See application file for complete search history.

(56) References Cited

U.S. PATENT DOCUMENTS 6,383,300 B1 5/2002 Saito et al.
7,622,007 B2 11/2009 Nakaiso
7,625,205 B2 12/2009 Sasajima et al.
7,795,143 B2 * 9/2010 Maeda et al. ................. 438/678
2006/0258174 A1 11/2006 Sakai et al.
2009/0305517 A1 12/2009 Nakashima et al.

FOREIGN PATENT DOCUMENTS

| JP | A-6-151312 | 5/1994 |
| JP | A-8-64532 | 3/1996 |
| JP | A-10-335317 | 12/1998 |
| JP | A-2001-15440 | 1/2001 |
| JP | A-2003-209064 | 7/2003 |

OTHER PUBLICATIONS

Feb. 18, 2010 Office Action issued in U.S. Appl. No. 12/226,323.

* cited by examiner

*Primary Examiner* — David Nhu
(74) *Attorney, Agent, or Firm* — Oliff & Berridge, PLC

(57) ABSTRACT

A substrate processing apparatus, including: a reaction container in which a substrate is processed; a seal cap, brought into contact with one end in an opening side of the reaction container via a first sealing member and a second sealing member so as to seal the opening of the reaction container air-tightly; a first gas channel, formed in a region between the first sealing member and the second sealing member in a state where the seal cap is in contact with the reaction container; a second gas channel, provided to the seal cap and through which the first gas channel is in communication with an inside of the reaction container; a first gas supply port that is provided to the reaction container and supplies a first gas to the first gas channel; and a second gas supply port that is provided to the reaction container and supplies a second gas into the reaction container, wherein a front end opening of the first gas supply port opening to the first gas channel, and a base opening of the second gas channel opening to the first gas channel being separated from each other in a state where the seal cap is in contact with the reaction container.

12 Claims, 7 Drawing Sheets

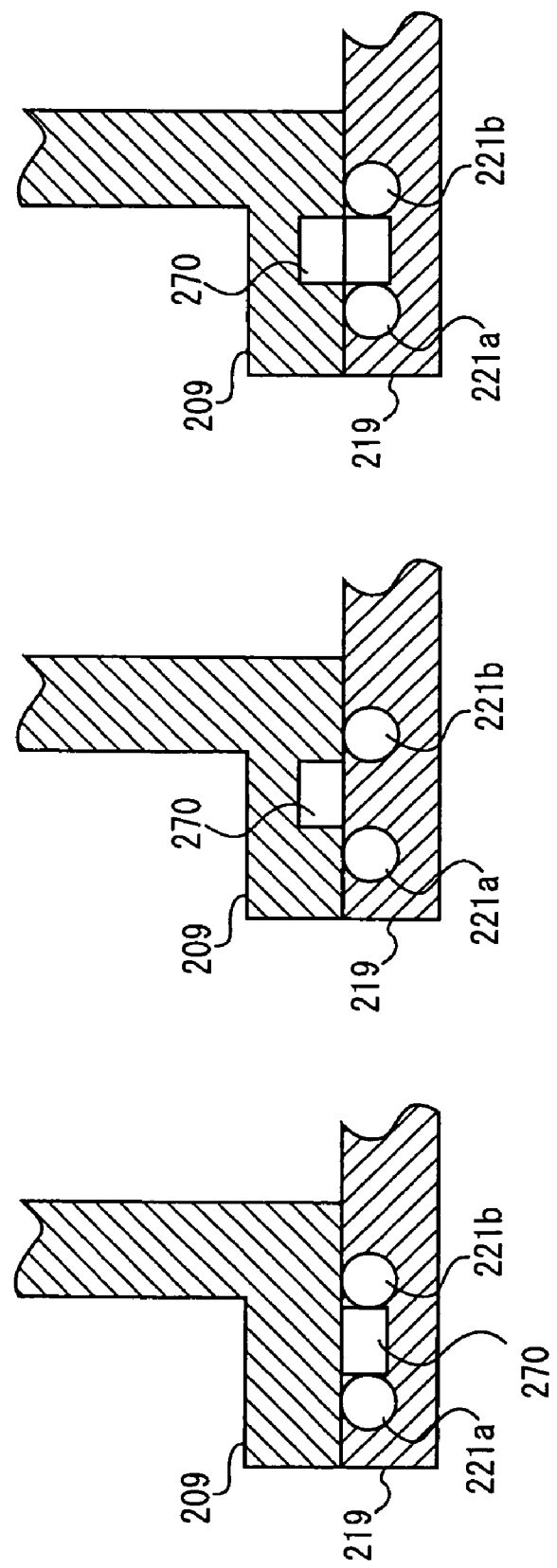

SUBSTRATE PROCESSING APPARATUS AND MANUFACTURING METHOD OF SEMICONDUCTOR DEVICE

This is a Divisional of application Ser. No. 12/226,323 filed Dec. 1, 2008, issued on Sep. 14, 2010 as U.S. Pat. No. 7,795,143, which in turn is a National Phase Application of PCT/JP2007/065616, filed Aug. 9, 2007. This application claims the benefit of Japanese Patent Application No. 2006-219677, filed Aug. 11, 2006. The entire disclosures of the prior applications are hereby incorporated by reference herein in their entirety.

TECHNICAL FIELD

The present invention relates to a substrate processing apparatus that processes substrates such as semiconductor wafers and glass substrates, and a semiconductor device manufacturing method including the step of processing a substrate using the substrate processing apparatus.

BACKGROUND ART

In using this type of substrate processing apparatus to form a silicon nitride ($Si_3N_4$) film or the like by a method such as a CVD (Chemical Vapor Deposition) method, a method is known that heats a low-temperature portion such as a furnace opening portion to suppress ammonium chloride ($NH_4Cl$) or other by-products from adhering to the low-temperature portion (see Patent Document 1). However, even with this method, adhesion of by-products may still occur in portions of the reaction chamber where the processing gas stagnates, generating particles. As a countermeasure, a method is known that suppresses adhesion of by-products by purging a gas from around the region where the adhesion of by-products occurs and thereby preventing the stagnation of the gas (see Patent Document 2).
Patent document 1: JP-A-8-64532
Patent Document 2: JP-A-10-335317

DISCLOSURE OF THE INVENTION

Problems that the Invention is to Solve

However, in the related art, a supply port for supplying a gas is disposed on a moving part, which necessitates a complicated structure.

An object of the present invention is to provide a substrate processing apparatus that prevents adhesion of by-products with a simple structure, and a manufacturing method of a semiconductor device.

Means for Solving the Problems

According to one aspect of the present invention, there is provided a substrate processing apparatus including: a reaction container in which a substrate is processed; a seal cap, brought into contact with one end in an opening side of the reaction container via a first sealing member and a second sealing member so as to seal the opening of the reaction container air-tightly; a first gas channel, formed in a region between the first sealing member and the second sealing member in a state where the seal cap is in contact with the reaction container; a second gas channel, provided to the seal cap and through which the first gas channel is in communication with an inside of the reaction container; a first gas supply port that is provided to the reaction container and supplies a first gas to the first gas channel; and a second gas supply port that is provided to the reaction container and supplies a second gas into the reaction container, wherein a front end opening of the first gas supply port opening to the first gas channel, and a base opening of the second gas channel opening to the first gas channel being separated from each other in a state where the seal cap is in contact with the reaction container.

According to another aspect of the present invention, there is provided a substrate processing apparatus including: a reaction tube in which a substrate is processed; a manifold having one end connected to an opening of the reaction tube; a seal cap, brought into contact via a first sealing member and a second sealing member with another end of the manifold on the opposite side of the one end connected to the reaction tube, so as to seal air-tightly an opening in the another end of the manifold; a first gas channel, defined by a recessed portion provided along the first sealing member and the second sealing member and in at least a portion of at least one of the manifold and the seal cap in a region between the first sealing member and the second sealing member, in a state where the seal cap is in contact with the manifold; a second gas channel, provided to the seal cap and through which the first gas channel is in communication with an inside of the reaction tube; a first gas supply port that is provided to the manifold and supplies a first gas to the first gas channel; and a second gas supply port that is provided to the manifold and supplies a second gas into the reaction tube, wherein a portion of the first gas supply port opening to the first gas channel, and a portion of the second gas channel opening to the first gas channel being positioned so as not to overlap each other in a state where the seal cap is in contact with the manifold.

According to yet another aspect of the present invention, there is provided a substrate processing apparatus including: a reaction container in which a substrate is processed; a seal cap, brought into contact with one end in a opening side of the reaction container via a first sealing member and a second sealing member, so as to seal the opening of the reaction container air-tightly; a first gas channel, defined by an annular recessed portion provided in at least one of the reaction container and the seal cap in a region between the first sealing member and the second sealing member in a state where the seal cap is in contact with the reaction container; a second gas channel, provided to the seal cap and through which the first gas channel is in communication with an inside of the reaction container; a first gas supply port that is provided to the reaction container and supplies a first gas to the first gas channel; and a second gas supply port that is provided to the reaction container and supplies a second gas into the reaction container, wherein a portion of the first gas supply port opening to the first gas channel, and a portion of the second gas channel opening to the first gas channel being separated from each other in a state where the seal cap is in contact with the reaction container.

According to still another aspect of the present invention, there is provided a substrate processing apparatus including: a reaction container in which a substrate is processed; a seal cap, brought into contact with one end in an opening side of the reaction container via a first sealing member and a second sealing member, so as to seal the opening of the reaction container air-tightly; a first gas channel, formed in a region between the first sealing member and the second sealing member in a state where the seal cap is in contact with the reaction container; a second gas channel, provided to the seal cap and through which the first gas channel is in communication with an inside of the reaction container; and a gas supply port that is provided to the reaction container and supplies a gas to the first gas channel, wherein a portion of the first gas supply port opening to the first gas channel, and a portion of the second gas channel opening to the first gas channel being separated from each other is a state where the seal cap is in contact with the reaction container.

According to yet another aspect of the present invention, there is provided a method of manufacturing a semiconductor device, comprising the steps of: loading a substrate into a reaction container; forming a first gas channel in a region between a first sealing member and a second sealing member, by bringing a seal cap into contact with one end in an opening side of the reaction container via the first sealing member and the second sealing member so as to seal the opening of the reaction container air-tightly; processing the substrate by supplying a first gas to the first gas channel through a first gas supply port provided to the reaction container, and supplying the first gas supplied to the first gas channel into the reaction container through a second gas channel that is provided to the seal cap to connect the first gas channel to the reaction container, and supplying a second gas into the reaction container through a second gas supply port provided to the reaction container; and unloading the processed substrate from the reaction container.

According to still another aspect of the present invention, there is provided a method of manufacturing a semiconductor device, comprising the steps of: loading a substrate into a reaction container; forming a first gas channel in a region between a first sealing member and a second sealing member, by bringing a seal cap into contact with one end in an opening side of the reaction container via the first sealing member and the second sealing member so as to seal the opening of the reaction container air-tight; processing the substrate by supplying a gas to the first gas channel through a first gas supply port provided to the reaction container, and supplying the gas supplied to the first gas channel into the reaction container through a second gas channel that is provided to the seal cap to connect the first gas channel to the reaction container; and unloading the processed substrate from the reaction container.

Advantage of the Invention

According to the present invention, a first gas channel is formed in at least a portion of a region surrounded by a reaction chamber, a seal cap, a first sealing member, and a second sealing member. This enables a supply port to be provided in a non-moving part, thereby preventing adhesion of by-products with a simple structure.

BRIEF DESCRIPTION OF THE DRAWINGS

FIG. 5 is a cross sectional view showing the vicinity of a portion in which a groove is formed in the substrate processing apparatus according to an embodiment of the present invention, in which (a) shows an example in which the groove is formed on an upper surface of the seal cap, (b) shows an examples in which the groove is formed on a lower surface of the manifold, and (c) shows an example in which the groove is formed on the upper surface of the seal cap and the lower surface of the manifold.

DESCRIPTION OF REFERENCE NUMERALS AND SIGNS

Figure 1:
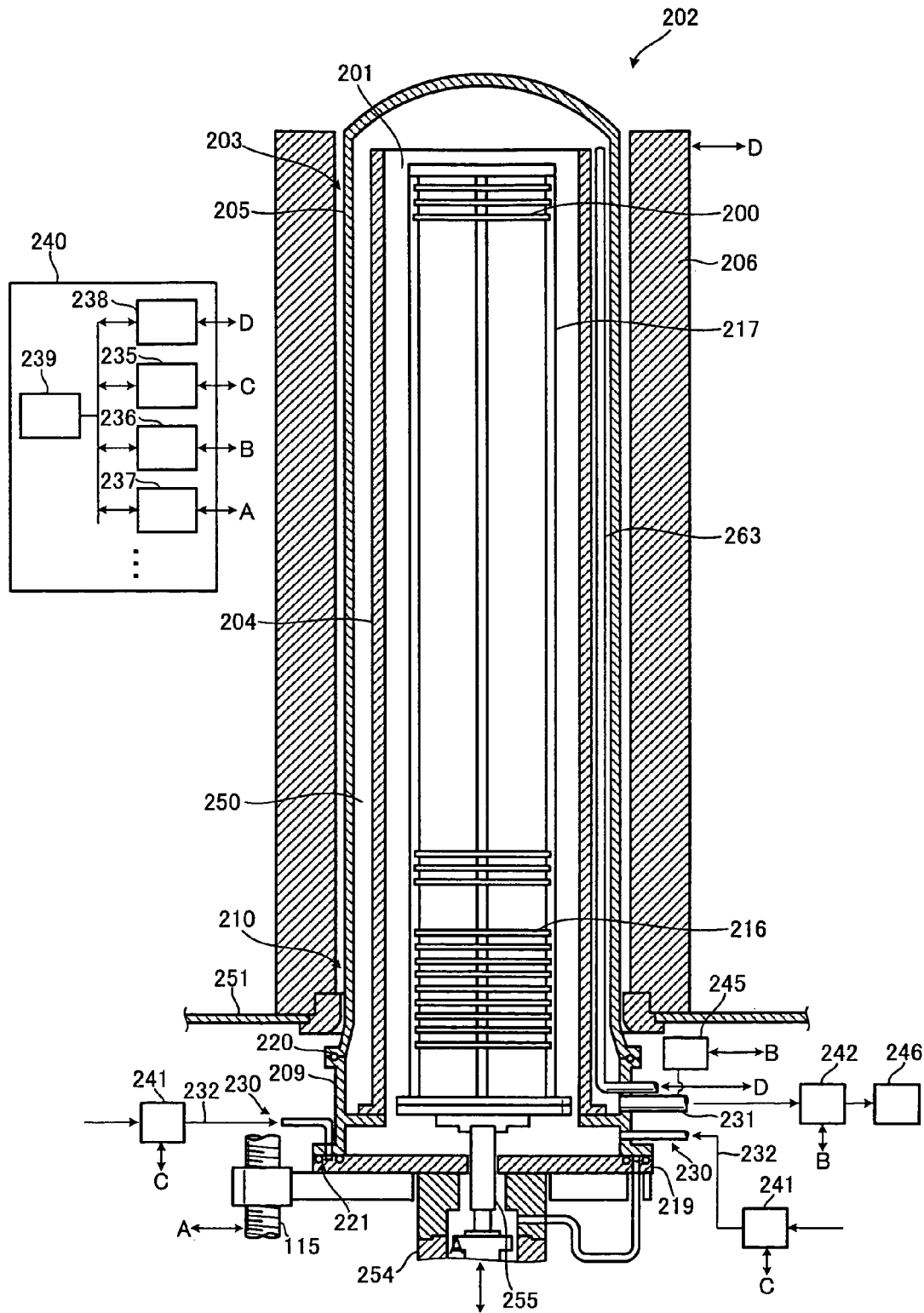
FIG. 1 is a longitudinal sectional view showing a processing furnace of a substrate processing apparatus according to an embodiment of the present invention.

100 Substrate processing apparatus
200 Wafer
209 Manifold
210 Reaction container
219 Seal cap
221a First O-ring
221b Second O-ring
230a First supply port
230b Second supply port
255 Rotation shaft
270 Groove
272 First gas channel
288a First vertical portion
288b Second vertical portion
290 Second gas channel
292 Outlet

BEST MODE FOR CARRYING OUT THE INVENTION

The following will describe an embodiment of the present invention with reference to the accompanying drawings.

FIG. 1 is a schematic longitudinal sectional view illustrating the construction of a processing furnace 202 of a substrate processing apparatus 100 suitably used in one embodiment of the present invention.

As shown in FIG. 1, the processing furnace 202 includes a heater 206 provided as a heating mechanism (heating means). The heater 206 is cylindrical in shape, and vertically supported by a heater base 251 provided as a holding plate.

Inside the heater 206 is disposed a process tube 203, concentric to the heater 206. The process tube 203 is provided as a reaction tube where substrates are processed. The process tube 203 includes an inner tube 204 provided as an inner reaction tube, and an outer tube 205 provided as an outer reaction tube around the inner tube 204. The inner tube 204 is made of a heat-resistant material such as quartz ($SiO_2$) or silicon carbide (SiC), and is cylindrical in shape with an open upper end and an open lower end. Inside the cylindrical hollow space of the inner tube 204 is a processing chamber 201 where substrates are processed. The processing chamber 201 is configured to store wafers 200 (substrates) using a boat 217 (described later), by which the wafers 200 are horizontally held and vertically aligned over one another in multiple stages. The outer tube 205 is made of a heat-resistant material such as quartz or silicon carbide. The outer tube 205, cylindrical in shape and concentric to the inner tube 204, has an inner diameter larger than the outer diameter of the inner tube 204. The upper end of the outer tube 205 is closed and the lower end is open.

Below the outer tube 205 is disposed a manifold 209, concentric to the outer tube 205. The manifold 209 is made of, for example, stainless steel or the like, and is cylindrical in shape with an open upper end and an open lower end. The manifold 209 is coupled to the process tube 203 (inner tube 204 and outer tube 205) to support these members. Between the manifold 209 and the outer tube 205, an O-ring 220 is provided as a sealing member. The heater base 251 supports the manifold 209 to vertically support the process tube 203. The process tube 203 and the manifold 209 constitute a reaction container 210.

The manifold 209 is coupled to a plurality of supply ports 230 (first supply port 230a and second supply port 230b, described later with reference to FIG. 2), so that the supply ports 230 are in communication with the processing chamber 201. The supply ports 230 are connected to gas supply lines 232. A process-gas supply source and an inert gas supply source (described later) are respectively connected to the gas supply lines 232 on the upstream side, i.e., on the opposite side of the end connected to the supply ports 230, via an MFC (mass flow controller) 241 provided as a gas flow rate controller. The MFC 241 includes, as described later, a first MFC 241a, a second MFC 241b, and a third MFC 241c (see FIG. 2). The MFC 241 is electrically connected to a gas flow rate controller 235, which controls the flow rate of supplied gas at a desirable timing to provide a desired flow rate.

The manifold 209 includes an exhaust pipe 231 through which the atmosphere inside the processing chamber 201 is discharged. The exhaust pipe 231 is disposed at a lower end portion of a tubular space 250 defined by the clearance gap between the inner tube 204 and the outer tube 205, and is in communication with the tubular space 250. An evacuator 246, such as a vacuum pump, is coupled to the exhaust pipe 231 on the downstream side, i.e., on the opposite side of the end connected to the manifold 209, via a pressure sensor 245 as a pressure detector and a pressure adjuster 242. With this configuration, the evacuator 246 can evacuate to create a predetermined pressure (vacuum) in the processing chamber 201. The pressure adjuster 242 and the pressure sensor 245 are electrically connected to a pressure controller 236, which controls the pressure adjuster 242 at a desirable timing based on the pressure detected by the pressure sensor 245, so as to provide a desired pressure in the processing chamber 201.

Below the manifold 209 is provided a seal cap 219, which is a furnace cap capable of sealing the lower end opening of the manifold 209 air-tightly. The seal cap 219 can be brought into contact with the lower end of the manifold 209 from below. The seal cap 219 is a disc-like member made of a metal such as stainless steel. On an upper surface of the seal cap 219 is provided a plurality of O-rings 221, provided as a sealing member, which are brought into contact with the lower end of the manifold 209. Via the O-rings 221 (first O-ring 221a and second O-ring 221b, described later), the seal cap 219 is brought into contact with the lower end of the manifold 209 on the opposite side of the end connected to the outer tube 205, so as to seal the open lower end of the manifold 209 air-tightly. On the opposite side of the seal cap 219 with respect to the processing chamber 201 is disposed, a rotation mechanism (rotation means) 254 that rotates the boat. The rotation mechanism 254 has a rotation shaft 255 that penetrates through the seal cap 219 and is coupled to the boat 217 later described. The rotation mechanism 254 rotates the boat 217 to spin the wafers 200. A boat elevator 115, provided as an elevation mechanism (elevation means), vertically provided outside the process tube 203 realizes a vertical ascending and descending movement of the seal cap 219, enabling the boat 217 to be carried in and out of the processing chamber 201. The rotation mechanism 254 and the boat elevator 115 are electrically connected to a drive controller 237, which controls these members at a desirable timing to realize desired operations.

The boat 217, provided as a substrate holder, is made of a heat-resistant material such as quartz or silicon carbide. The boat 217 horizontally holds each wafer 200 as a substrate and vertically aligns the wafers 200 over one another in multiple stages, with the centers of the wafers 200 lined up. In a lower portion of the boat 217, heat-insulating plates 216 are provided as disc-like heat-insulating members. The heat-insulating plates 216 are made of a heat-resistant material such as quartz or silicon carbide, and are horizontally disposed over one another in multiple stages so as to suppress the transfer of heat from the heater 206 to the manifold 209.

Inside the process tube 203 is disposed a temperature sensor 263 provided as a temperature detector. The heater 206 and the temperature sensor 263 are electrically connected to a temperature controller 238. The temperature controller 238 controls the temperature in the processing chamber 201 at a desirable timing so that a desired temperature distribution is obtained in the processing chamber 201. This control is performed by adjusting supplied electricity to the heater 206 based on temperature information detected by the temperature sensor 263.

The gas flow rate controller 235, the pressure controller 236, the drive controller 237, and the temperature controller 238 constitute an operation unit and an input/output unit, and are electrically connected to a main controller 239, which controls the entire operation of the substrate processing apparatus. The gas flow rate controller 235, the pressure controller 236, the drive controller 237, the temperature controller 238, and the main controller 239 constitute a controller 240.

In the following, a peripheral structure of the manifold 209 and the rotation mechanism 254 will be described with reference to FIG. 2 through FIG. 7.

Figure 2:
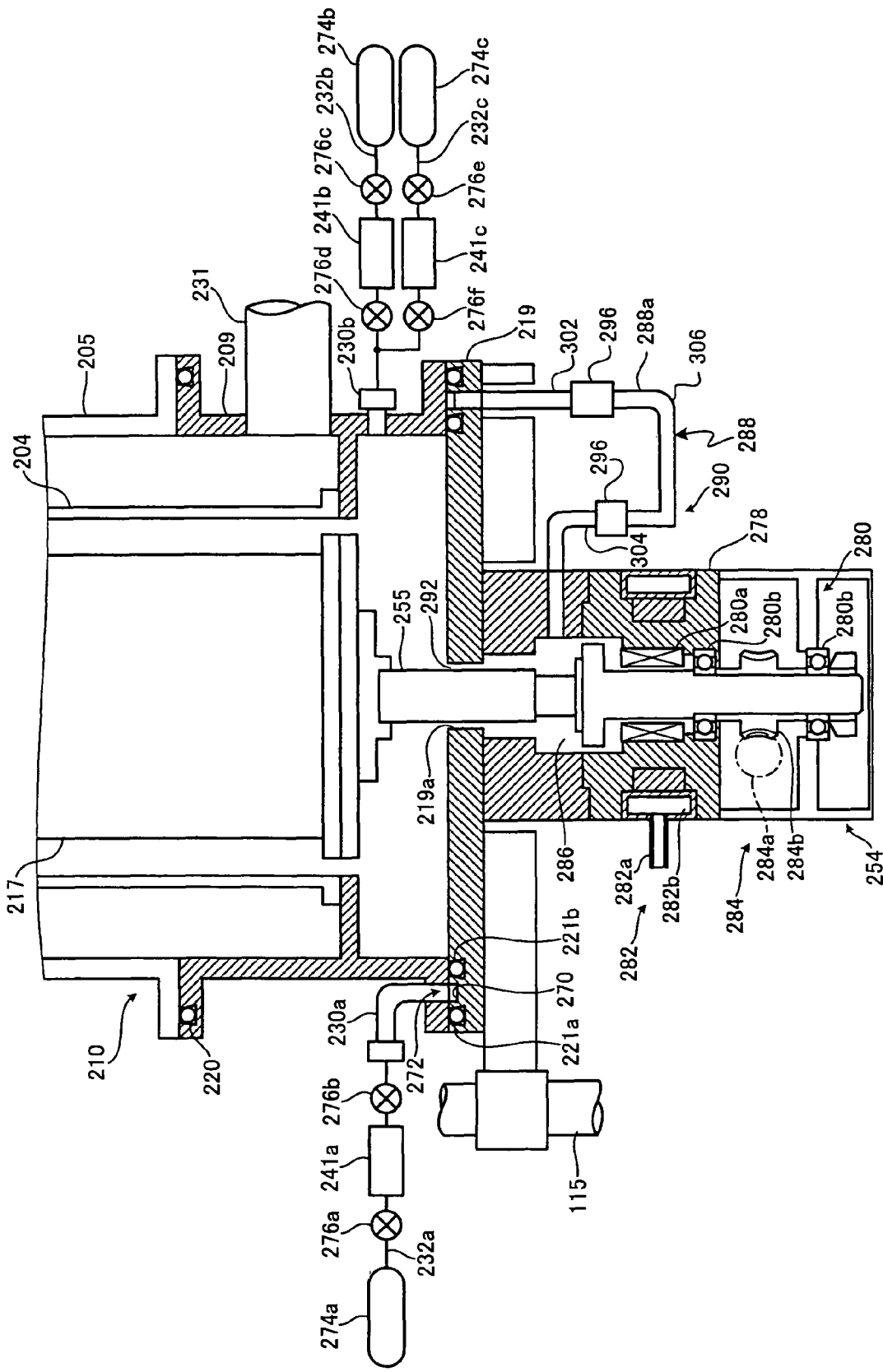
FIG. 2 is a longitudinal sectional view showing the vicinity of a lower end portion of the processing furnace of the substrate processing apparatus according to an embodiment of the present invention.
Figure 3:
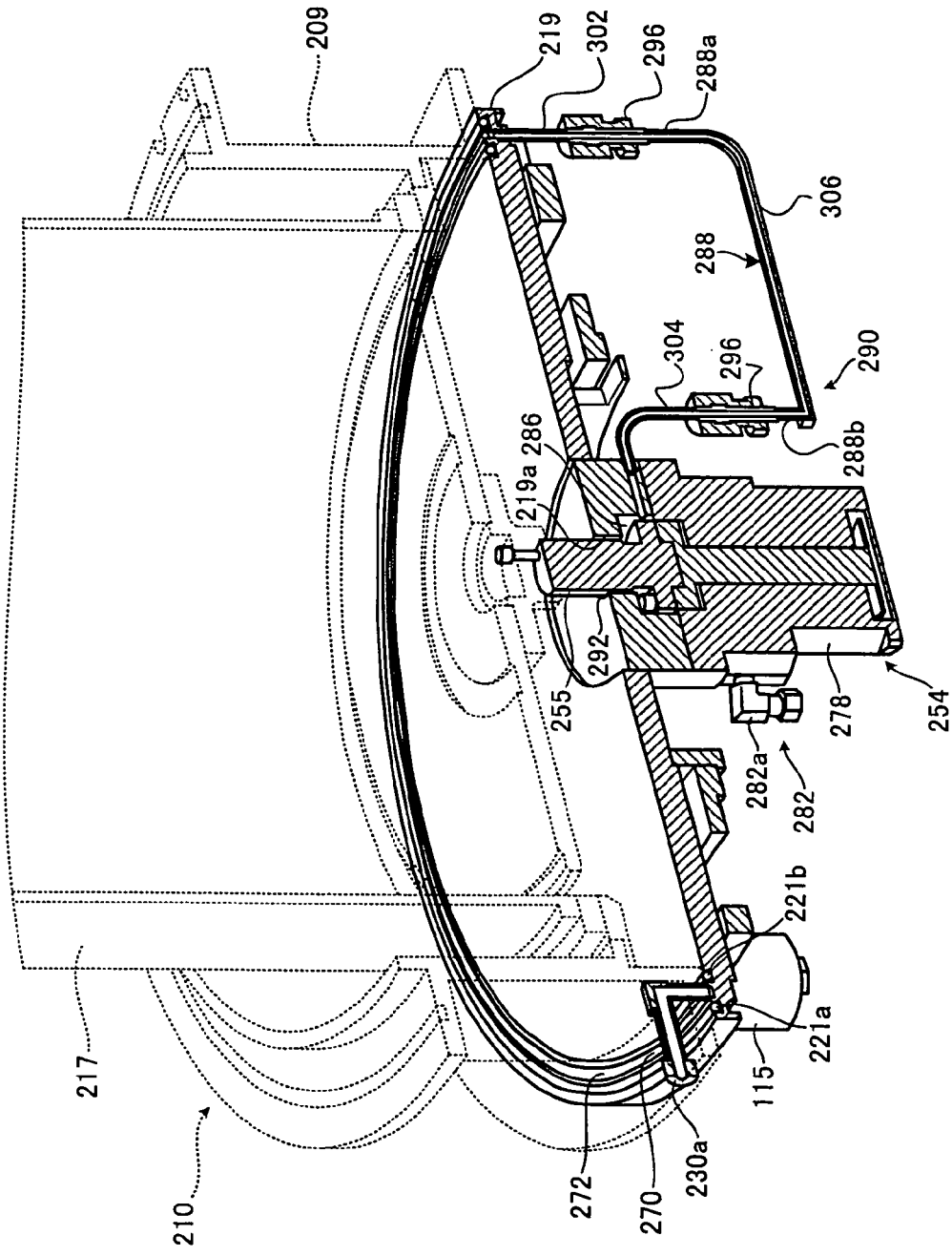
FIG. 3 is a perspective view showing the vicinity of a lower end portion of the processing furnace of the substrate processing apparatus according to an embodiment of the present invention.

As shown in FIG. 2 and FIG. 3, the O-rings 221 include the first O-ring 221a, provided as a first sealing member, and the second O-ring 221b, provided as a second sealing member. That is, via the first O-ring 221a and the second O-ring 221b, the seal cap 219 is in contact with the opening at one end of the reaction container 210 (manifold 209), so as to seal the opening of the reaction container 210 air-tightly.

A groove 270 is formed in at least a portion of at least one of the reaction container 210 (manifold 209) and the seal cap 219 in a region surrounded by the reaction container 210 (manifold 209), the seal cap 219, the first O-ring 221a, and the second O-ring 221b, when the seal cap 219 is in contact with the reaction container 210 (manifold 209). The groove 270 is one of the constituting elements of a first gas channel 272, and formed concentric to the first O-ring 221a and the second O-ring 221b. More specifically, as shown in FIG. 3 for example, the groove 270 is provided in the shape of a ring (circular ring) in a region between the first O-ring 221a and the second O-ring 221b formed on the upper surface of the seal cap 219, along the periphery of the seal cap 219.

The groove 270 may be in the shape of a circular arc, instead of a circular ring. For example, the groove 270 may be formed in the shape of a circular arc in at least a portion of the region between the first O-ring 221a and the second O-ring 221b formed on the upper surface of the seal cap 219, with a center angle of, for example, 180°, along the periphery of the seal cap 219. Further, the groove 270 may be a circular arc with a center angle of no more than 180°, for example, 90°. Further, the groove 270 may be a circular arc with a center angle of 180° or greater, for example, 270°.

Figures 4A, 4B:
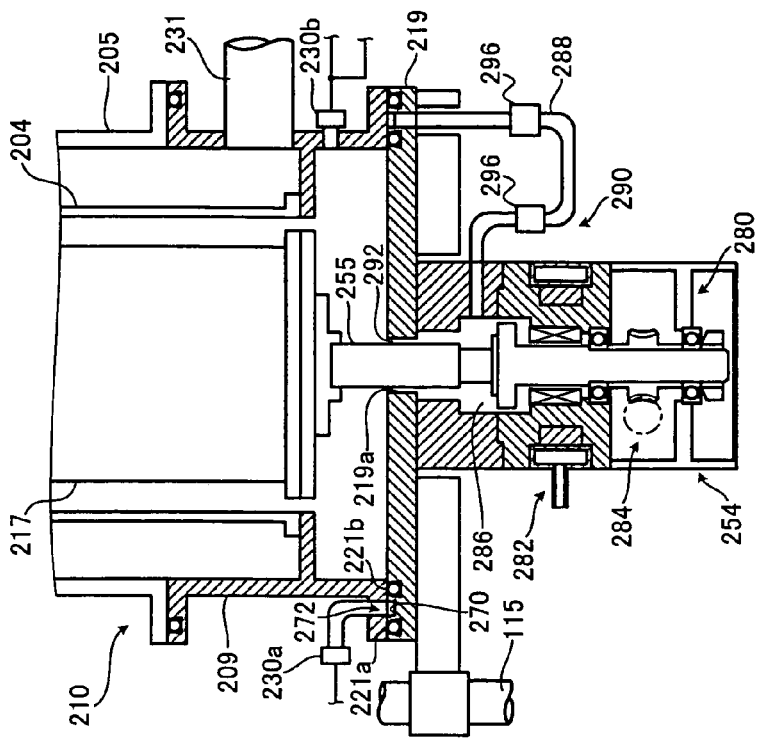
FIG. 4 is a longitudinal sectional view showing the vicinity of a lower end portion of the processing furnace of the substrate processing apparatus according to an embodiment of the present invention, in which (a) shows a state in which a manifold and a seal cap are separated from each other, and (b) shows a state in which the manifold and the seal cap are in contact with each other.

As shown in FIG. 4, the first gas channel 272 is formed in a portion where the groove 270 is provided as a result of the seal cap 219 being driven and lifted by the boat elevator 115 (in the direction of arrow a in FIG. 4(a)) and making contact with the lower end of the reaction container 210 (manifold 209) via the first O-ring 221a and the second O-ring 221b (see FIG. 4(b)).

In this manner, the first gas channel 272 is formed in a space surrounded by the manifold 209, the seal cap 219, and the double O-ring (first O-ring 221a and second O-ring 221b), along the periphery of the seal cap 219, so as to be separable (detachable) by the ascending and descending movement of the boat elevator 115. In this way, the gas channel can be formed in a simple structure in a moving part such as the seal cap 219.

In the present embodiment, the groove 270 is formed on the upper surface of the seal cap 219, as shown in the enlarged view of FIG. 5(a). However, the groove 270 may be formed on the side of the manifold 209 (reaction container 210), i.e., on the lower surface of the manifold 209 (reaction container 210) as shown in the enlarged view of FIG. 5(b), or on both of the seal cap 219 and the manifold 209, i.e., on the upper surface of the seal cap 219 and the lower surface of the manifold 209 as shown in the enlarged view of FIG. 5(c).

The supply ports 230 include the first supply port 230a and the second supply port 230b. As shown in FIG. 2, the first supply port 230a is provided to the reaction container 210 (manifold 209) to supply a gas to the first gas channel 272. More specifically, the first supply port 230a is connected to a first gas supply line 232a, which is provided with a first gas supply source 274a, a first valve 276a, a first MFC 241a, and a second valve 276b, in this order from the upstream side. The first gas supply source 274a stores therein an additive gas such as ammonia ($NH_3$) gas or nitrogen ($N_2$) gas, which is supplied to the first supply port 230a via the first valve 276a, the first MFC 241a, and the second valve 276b provided to the first gas supply line 232a.

The first gas supply source 274a may store an inert gas such as argon (Ar) gas or helium (He) gas.

The second supply port 230b is provided to the reaction container 210 (manifold 209) to supply a gas to the reaction container 210. More specifically, the second supply port 230b is connected to a second gas supply line 232b, which is provided with a second gas supply source 274b, a third valve 276c, a second MFC 241b, and a fourth valve 276d, in this order from the upstream side. The second gas supply source 274b stores therein a chlorosilane gas such as DCS (dichlorosilane; $SiH_2Cl_2$), TCS (trichlorosilane; $SiHCl_3$), or HCD (hexachlorodisilane; $Si_2Cl_6$). The chlorosilane gas is supplied to the second supply port 230b via the third valve 276c, the second MFC 241b, and the fourth valve 276d provided to the second gas supply line 232b.

A third gas supply line 232c is connected to the second gas supply line 232b between the second supply port 230b and the fourth valve 276d. The third gas supply line 232c is provided with a third-gas supply source 274c, a fifth valve 276e, a third MFC 241c, and a sixth valve 276f, in this order from the upstream side. The third-gas supply source 274c stores therein a cleaning gas such as a fluorine ($F_2$) gas, a nitrogen trifluoride ($NF_3$) gas, and a chlorine trifluoride ($ClF_3$) gas. The cleaning gas is supplied to the second supply port 230b via the fifth valve 276e, the third MFC 241c, the sixth valve 276f, and the second gas supply line 232b provided to the third gas supply line 232c.

Because the second supply port 230b is connected to both the second gas supply line 232b supplying a chlorosilane gas and the third gas supply line 232c supplying a cleaning gas, a backflow of by-products into the second gas supply port 230b or stagnation of by-products therein can be prevented compared with the case where the chlorosilane-gas supply line and the cleaning-gas supply line are connected to their respective supply ports. This prevents the adhesion of by-products to the inner wall surface of the second gas supply port 230b. Further, cost can be reduced by sharing the supply port.

The rotation mechanism 254 includes a rotation mechanism main body 278. The rotation mechanism main body 278 includes the rotation shaft 255, a bearing unit 280, a cooling unit 282, and a driving unit 284. Inside the rotation mechanism main body 278, a predetermined space is provided between the inner wall of the rotation mechanism main body 278 and the rotation shaft 255 to form a hollow portion 286 having an open upper end. The bearing unit 280 includes a magnetic bearing 280a and two ball bearings 280b disposed below the magnetic bearing 280a, and rotatably supports the rotation shaft 255 about the rotation mechanism main body 278.

The cooling unit 282 includes a coolant channel 282b provided around the magnetic bearing 280a, and a coolant pipe 282a connected to the coolant channel 282b. The cooling unit 282 is provided to cool the rotation mechanism main body 278 by supplying and discharging a coolant through the coolant pipe 282a and circulating the coolant through the coolant channel 282b. The driving unit 284 includes a driving gear 284a coupled to a drive source (not shown), and an input gear 284b formed on the rotation shaft 255 and in mesh with the driving gear 284a. The driving unit 284 is provided to transmit the driving force of the drive source to the rotation shaft 255 and rotate the rotation shaft 255 at a predetermined number of revolutions.

A gas supply pipe 288, one of the constituting elements of a second gas channel 290, has one end connected to the seal cap 219 and the other end connected to the rotation mechanism 254. More specifically, the gas supply pipe 288 is in communication with the first gas channel 272 on the upstream side, and the hollow portion 286 of the rotation mechanism main body 278 on the downstream side. The second gas channel 290, in communication with the first gas channel 272, is realized by the gas supply pipe 288 and the hollow portion 286 of the rotation mechanism main body 278. The seal cap 219 includes a through hole 219a through which the rotation shaft 255 is provided. The space between the through hole 219a and the rotation shaft 255 defines an outlet 292, through which the second gas channel 290 is in communication with the reaction container 210.

As shown in FIG. 2 and FIG. 3, the gas supply pipe 288 includes a first vertical portion 288a and a second vertical portion 288b, with which the gas supply pipe 288 is separable. Specifically, the first vertical portion 288a and the second vertical portion 288b of the gas supply pipe 288 are each provided with a joint 296, and a third pipe 306 (U-shaped member, for example), defining a portion of the first vertical portion 288a and a portion of the second vertical portion 288b, is detachably provided via the joints 296 to a first pipe 302 defining a portion of the first vertical portion 288a and a second pipe 304 defining a portion of the second vertical portion 288b. Here, because the joint 296 connecting the first pipe 302 and the third pipe 306, and the joint 296 connecting the second pipe 304 and the third pipe 306 are both vertically oriented to the pipes, the third pipe 306 can be detached and attached with ease. More specifically, when the by-products of reaction have adhered to the gas supply pipe 288 and necessitated service, replacement or the like of the third pipe 306 can easily be performed by detaching and attaching it. That is, ease of maintenance can be improved.

It is preferable to heat the gas supply pipe 288 by heating means (not shown), because it suppresses or prevents adhering of the reaction by-products or the like to the gas supply pipe 288.

Figure 6A:
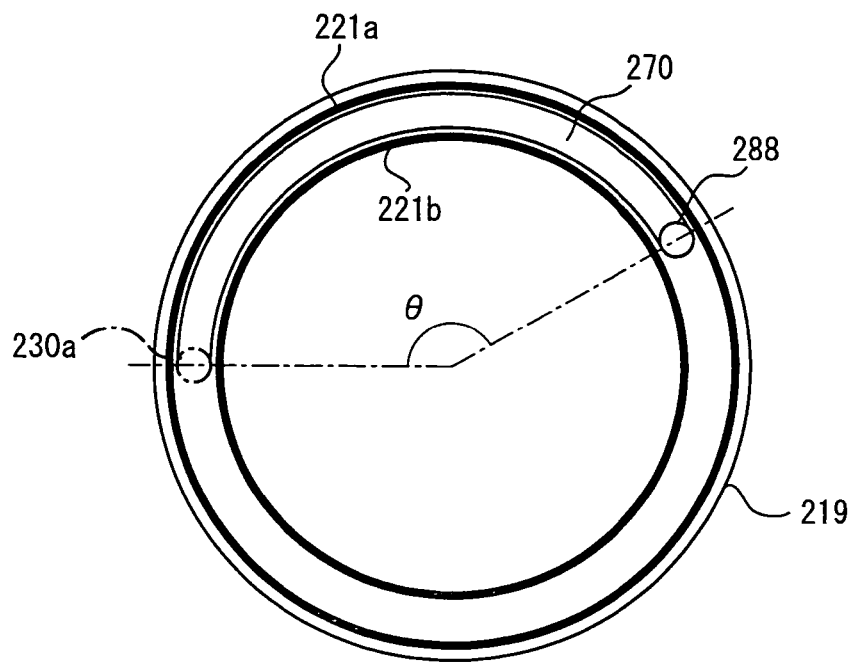
FIG. 6 is a schematic diagram, in which (a) shows a positional relationship between a front end opening of a supply port and a base opening of a gas supply pipe when the groove is formed as a circular arc in the substrate processing apparatus according to an embodiment of the present invention, and (b) shows a positional relationship between the front end opening of the supply port and the base opening of the gas supply pipe when the groove is formed as a circular ring.

When the groove 270 is formed as a circular arc instead of a circular ring as described above, it is preferable to connect the supply port 230a to one end of the groove 270 forming an arc channel, and the gas supply pipe 288 to the other end of the groove 270, as shown in FIG. 6(a). This arrangement facilitates formation of an active gas flow throughout the arc channel formed by the groove 270, without forming a "pouch". In contrast, when the supply port 230a and the gas supply pipe 288 are connected to portions of the circular arc channel other than these ends, a pouch is created and no active gas flow occurs. The $NH_3$ diffused and stagnated in the pouch will not be purged sufficiently and accumulates therein. As used herein, the "pouch" refers to a dead-end portion of the groove, pipe, and the like with a closed end.

As described, the groove 270 forming a channel for $NH_3$ should be formed along the double O-ring (first O-ring 221a and second O-ring 221b) in at least a portion of at least one of the manifold 209 and the seal cap 219 in a region between the first O-ring 221a and the second O-ring 221b, when the seal cap is in contact with the manifold 209 via the double O-ring. It is more preferable to form the groove 270 as a circular ring along the entire periphery as in the embodiment described with reference to FIG. 6(b), instead of providing it as a circular arc in at least a portion of the region between the first O-ring 221a and the second O-ring 221b. This is because forming the groove 270 as a circular ring facilitates the formation of an active gas flow throughout the entire region between the first O-ring 221a and the second O-ring 221b and thereby suppresses accumulation of gas. Further, in terms of processibility, it is easier to form the groove 270 along the entire periphery.

Figure 6B:
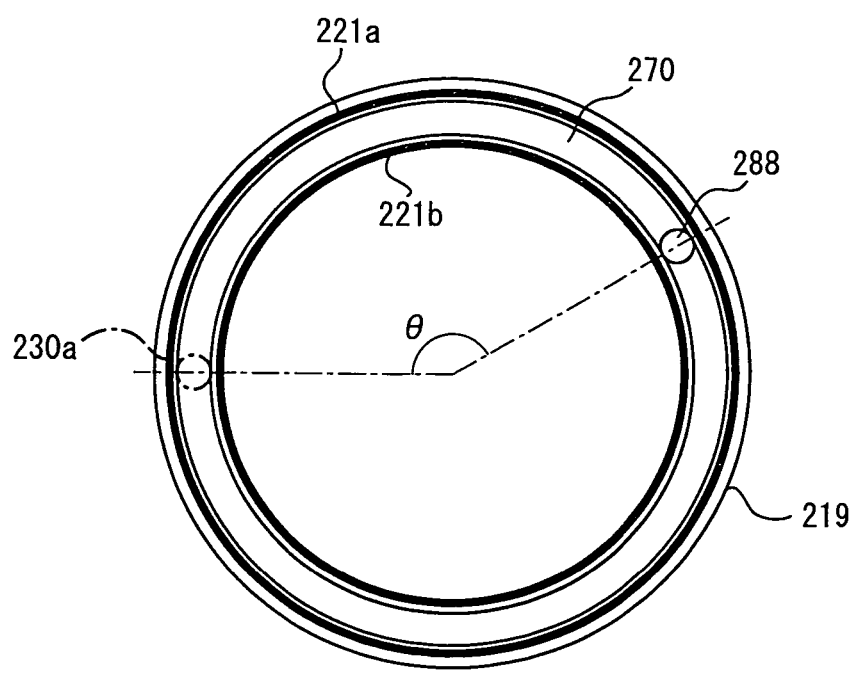

Note that, the center angle θ of the arc channel formed between the point at the front end opening of the $NH_3$ supply port 230a and the point at the base opening of the gas supply pipe 288 should preferably fall in a range of 90° to 270°, regardless of whether the groove 270 is formed as a circular arc as shown in FIG. 6(a), or a circular ring as shown in FIG. 6(b). When the center angle θ is too small, for example, 5° C., there will be partial stagnation of gas and no active gas flow occurs throughout the entire channel, which may lead to the formation of a pouch. Preferably, the center angle θ is about 180°. In other words, it is preferable that the point at the front end opening of the $NH_3$ supply port 230a and the point at the base opening of the gas supply pipe 288 be substantially opposite to each other with the rotation shaft therebetween.

As described above, the first supply port 230a, the first gas channel 272, the second gas channel 290, and the outlet 292 define a gas path through which the additive gas is supplied. Thus, the additive gas supplied to the first gas supply line 232a is supplied into the reaction container 210 through the central portion of the manifold 209, via the first supply port 230a, the first gas channel 272, the second gas channel 290, and the outlet 292. On the other hand, the chlorosilicon compound gas supplied to the second gas supply line 232b is supplied into the reaction container 210 through a side wall portion of the manifold 209 via the second supply port 230b. In this manner, the additive gas and the chlorosilane gas are supplied into the reaction container 210 through different supply ports.

The following will describe a method of forming a thin film on the wafers 200 using a CVD method, as one of manufacturing steps of a semiconductor device using the processing furnace 202 having the foregoing configuration. In the following description, the operation of each member constituting the substrate processing apparatus is controlled by the controller 240.

Upon charging of the wafers 200 into the boat 217 (wafer charge), the boat 217 holding the wafers 200 is lifted up by the boat elevator 115 and loaded into the processing chamber 201 (boat loading; substrate loading step), as shown in FIG. 4. In this state, the seal cap 219 seals the lower end of the manifold 209 via the first O-ring 221a and the second O-ring 221b. That is, the seal cap 219 is in contact with the opening at one end of the reaction container 210 via the first O-ring 221a and the second O-ring 221b to seal the opening of the reaction container 210 air-tightly and form the first gas channel 272 in at least a portion of the region surrounded by the reaction container 210, the seal cap 219, the first O-ring 221a, and the second O-ring 221b.

The evacuator 246 evacuates inside the processing chamber 201 to create a desired pressure (vacuum). Here, the pressure inside the processing chamber 201 is measured by the pressure sensor 245, and the pressure adjuster 242 is under feedback control based on the measured pressure. The heater 206 provides heat to obtain a desired temperature in the processing chamber 201. Here, the heater 206 is under feedback control based on temperature information detected by the temperature sensor 263, so that sufficient electricity is supplied to the heater 206 to provide a desired temperature distribution in the processing chamber 201. Following this, the rotation mechanism 254 rotates the boat 217 to spin the wafers 200.

Thereafter, an additive gas is supplied to the first gas channel 272 through the first supply port 230a provided to the reaction container 210. The additive gas supplied to the first gas channel 272 is then flown into the second gas channel 290 in communication with the first gas channel 272. The additive gas flown into the second gas channel 290 is supplied into the reaction container 210 through the outlet 292, through which the second gas channel 290 is in communication with the reaction container 210. While the additive gas is supplied, chlorosilane gas is supplied into the reaction container 210 through the second supply port 230b provided to the reaction container 210. The gas introduced into the reaction container 210 drifts upward inside the processing chamber 201 and is flown into the tubular space 250 through the upper end opening of the inner tube 204 to be discharged through the exhaust pipe 231. In its passage through the processing chamber 201, the gas makes contact with the surfaces of the wafers 200, and a thin film is deposited thereon by a thermal CVD reaction (substrate processing step).

Here, because the additive gas is supplied into the reaction container 210 by being flown around the rotation shaft 255 and through the outlet 292 formed in the clearance space between the rotation shaft 255 and the seal cap 219, at least a portion of the rotation shaft 255 below the seal cap 219 does not make contact with the corrosive chlorosilane gas, making it possible to prevent corrosion at least in this portion of the rotation shaft 255. Further, because the corrosive chlorosilane gas does not enter the rotation mechanism 254, no corrosion occurs in this part of the apparatus.

After a preset period of process time, the supply of the chlorosilane gas is stopped to end deposition, while the additive gas is still being supplied. This is followed by cutting the supply of the additive gas and supplying of inert gas from the inert gas supply source. This flushes inside the reaction container 210 with the inert gas, and the pressure inside the reaction container 210 returns to ordinary pressure.

Thereafter, the seal cap 219 is lowered by the boat elevator 115 and the lower end of the manifold 209 is opened. With the processed wafers 200 held in the boat 217, the boat 217 is discharged out of the reaction container 210 through the lower end of the manifold 209 (substrate discharge step). The processed wafers 200 are then unloaded from the boat 217 (wafer unloading).

As described above, in the substrate processing apparatus 100 of the present invention, the additive gas is not directly supplied into the rotation mechanism 254 from the gas supply source, but indirectly into the rotation mechanism 254 through the space (first gas channel 272) surrounded by the manifold 209, the seal cap 219, and the double O-ring (first O-ring 221a and second O-ring 221b) and formed along the periphery of the seal cap 219. In this way, the first supply port 230a used to supply the additive gas can be formed on the manifold 209, which is a non-moving part. This simplifies the structure by eliminating the need to provide a pipe for additive gas on a movable cable (not shown) or the like of the boat elevator 115.

The manifold 209 is heated to some extent by heat such as the radiant heat from the heater 206, or the heat transferred from the process tube 203. Thus, the additive gas can be heated preliminary by flowing through the first gas channel 272. The preliminarily heated additive gas is supplied into the reaction container 210 through the second gas channel 290 and the outlet 292. This suppresses temperature drop in portions of the furnace near the outlet 292, and promotes thermal decomposition of the additive gas. The preliminary heating effect of the additive gas can be enhanced by increasing the length of the first gas channel 272, i.e., by providing a larger center angle for the circular arc formed by the groove 270.

The mount position of the gas supply pipe 288 can be freely adjusted and the gas supply pipe 288 can be freely positioned by adjusting the region where the first gas channel 272 is provided, i.e., by adjusting the center angle of the circular arc formed by the groove 270. This enables the gas supply pipe 288 to be disposed at an optimum position without changing the layout of the other members.

Further, in the substrate processing apparatus 100 of the present invention, the supply port 230a provided on the manifold 209 and the gas supply pipe 288 provided on the seal cap 219 do not need to be directly connected to each other when the seal cap 219 is brought into contact with the manifold 209. Accordingly, no precise registration is needed for the front end opening of the supply port 230a and the base opening of the gas supply pipe 288. In the substrate processing apparatus 100 of the present invention, the front end opening of the $NH_3$ supply port 230a is only required to be positioned in a region between the first O-ring 221a and the second O-ring 221b where the $NH_3$ channel is formed, when the seal cap 219 is brought into contact with the manifold 209. In other words, the only requirement for the front end opening of the $NH_3$ supply port 230a is to meet the region between the first O-ring 221a and the second O-ring 221b. Because the region between the first O-ring 221a and the second O-ring 221b has a larger area than the front end opening of the $NH_3$ supply port 230a, position registration between the two can easily be performed.

On the other hand, when the substrate processing apparatus 100 is configured such that the supply port 230a and the gas supply pipe 288 are directly connected to each other when the seal cap 219 is brought into contact with the manifold 209, it would require precise position registration for the front end opening of the supply port 230a and the base opening of the gas supply pipe 288. Because the front end opening of the supply port 230a and the base opening of the gas supply pipe 288 have substantially the same area, it is very difficult to correctly mate these members (position registration is very difficult).

Further, in the substrate processing apparatus 100 of the present invention, the gas channel is formed by providing the groove 270 in the region between the first O-ring 221a and second O-ring 221b, along the first O-ring 221a and the second O-ring 221b. The channel formed in this region can create an active gas flow, as shown by the arrows in FIG. 7(a), and prevent the formation of a pouch. There accordingly will be no stagnation of $NH_3$ in the region between the first O-ring 221a and the second O-ring 221b. Further, by purging the channel formed by the groove 270 with an inert gas after the deposition process, the $NH_3$ in the channel can be purged quickly and sufficiently, eliminating residual $NH_3$ in the channel.

Figure 7A:
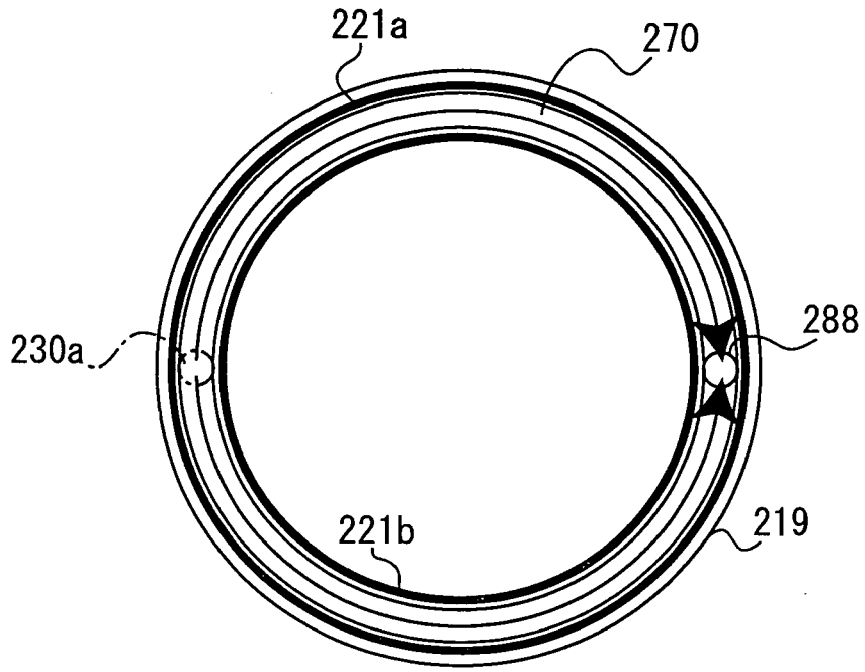
FIG. 7 is an explanatory diagram, in which (a) shows a gas flow through a gas channel in the substrate processing apparatus according to an embodiment of the present invention, and (b) shows a gas flow through a gas channel in a substrate processing apparatus according to a comparative example of the present invention.
Figure 7B:
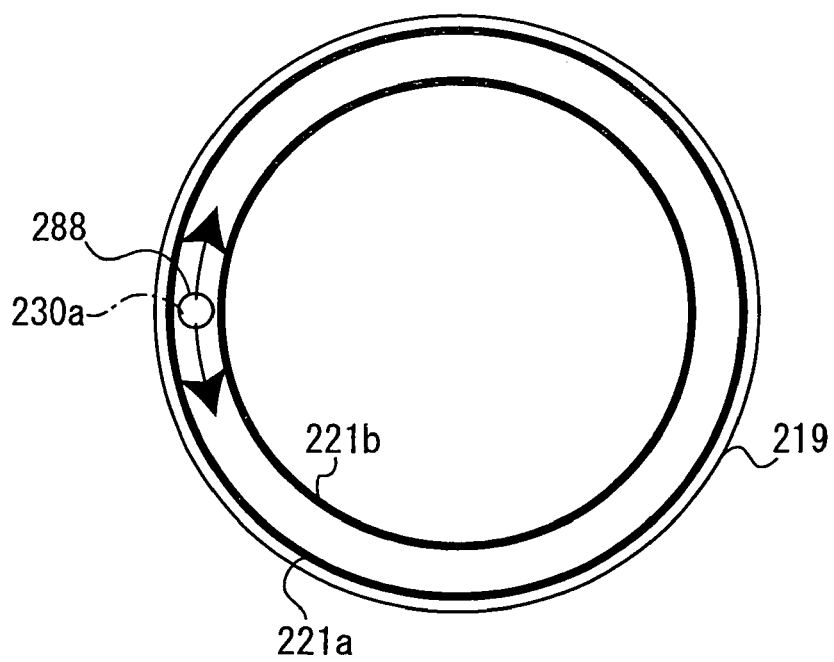

On the other hand, when the substrate processing apparatus 100 is configured such that the supply port 230a and the gas supply pipe 288 are directly connected to each other when the seal cap 219 is brought into contact with the manifold 209, there is a possibility that the $NH_3$ would diffuse from the junction between the supply port 230a and the gas supply pipe 288 and stagnate in the region between the first O-ring 221a and the second O-ring 221b interposed between the manifold 209 and the seal cap 219, as shown by the arrows in FIG. 7(b). In other words, a pouch is formed by a small space formed in the region between the first O-ring 221a and the second O-ring 221b interposed between the manifold 209 and the seal cap 219, and there will not be sufficient active gas flow in this portion of the region. The $NH_3$ diffused and stagnated at the pouch will not be purged sufficiently and remains therein. This may lead to a safety problem that the residual $NH_3$ diffuses out of the furnace during unloading of the boat after deposition.

In the substrate processing apparatus 100 of the present invention, the contact portion between the seal cap 219 and the manifold 209 is raised to a temperature of about 100° C. to 200° C. during deposition. Thus, by flowing $NH_3$ through the channel formed by the groove 270 in the region between the first O-ring 221a and the second O-ring 221b, the $NH_3$ can be preliminarily heated by the heat of the seal cap 219 and the manifold 209, as described above.

The following will describe examples.

Example 1

The substrate processing apparatus 100 of the present invention was used to perform a deposition process forming a $Si_3N_4$ film on a wafer using a thermal CVD method. DCS and $NH_3$ were used as chlorosilane gas and additive gas, respectively. The process temperature was 550° C. to 900° C., and the pressure in the processing chamber was 1 to 100 Pa. The deposition process was performed at a DCS/$NH_3$ flow rate ratio of 1:3. The results were desirable, with an intrawafer film thickness uniformity of ±0.7%, and an interwafer film thickness uniformity of ±1.8%. After the deposition process, the rotation mechanism 254 was detached from the seal cap 219 to check inside of the rotation mechanism 254. There was no adhesion of the by-product $NH_4Cl$ in portions of the rotation shaft 255 below the seal cap 219 nor inside the rotation mechanism 254.

Example 2

The substrate processing apparatus 100 of the present invention was used to perform a deposition process forming a $Si_3N_4$ film on a wafer using a thermal CVD method. DCS and $NH_3$ were used as chlorosilane gas and additive gas, respectively. The process temperature was 550° C. to 900° C., and the pressure in the processing chamber was 1 to 100 Pa. The deposition process was performed at a $DCS/NH_3$ flow rate ratio of 1:1.5. The results were desirable, similar to Example 1 both in intrawafer film thickness uniformity and interwafer film thickness uniformity. After the deposition process, the rotation mechanism 254 was detached from the seal cap 219 to check inside of the rotation mechanism 254. There was no adhesion of the by-product $NH_4Cl$ in portions of the rotation shaft 255 below the seal cap 219 nor inside the rotation mechanism 254.

As shown by these results, with the substrate processing apparatus 100 of the present invention, adhesion of by-products to the surrounding of the rotation shaft 255 can be prevented while ensuring intrawafer film thickness uniformity and interwafer film thickness uniformity.

The deposition process may be performed while purging an inert gas such as a nitrogen ($N_2$) gas, an argon (Ar) gas, or a helium (He) gas from regions around the rotation shaft 255.

The inert gas may also be flown through regions around the rotation shaft 255 to purge the rotation shaft 255 during a cleaning process removing the film adhered inside the reaction container 210. In this case, a blank boat 217 is loaded into the reaction container 210, and an inert gas, such as $N_2$, is supplied to the first gas channel 272 through the first supply port 230a after forming the first gas channel 272. The inert gas supplied to the first gas channel 272 is then flown through the second gas channel 290, and the inert gas flowing through the second gas channel 290 is supplied into the reaction container 210 through the outlet 292. Thereafter, while supplying the inert gas, a cleaning gas is supplied into the reaction container 210 through the second supply port 230b. The cleaning gas is supplied from the third-gas supply source 274c via the third gas supply line 232c and the second gas supply line 232b. The effects described in the foregoing embodiment can also be obtained in this way.

While the foregoing Examples 1 and 2 described the case where the $Si_3N_4$ film is deposited, the invention is applicable not only to the deposition of the $Si_3N_4$ film but generally to a whole range of deposition processes using two or more kinds of gases such as SiON, HTO (High Temperature Oxide ($SiO_2$)), SiC, and SiCN. For example, when depositing a SiON film using $SiH_2Cl_2$, $N_2O$, and $NH_3$, $NH_3$ or $N_2O$ is supplied from the side of the rotation shaft. When depositing an HTO film using $SiH_2Cl_2$, or $SiH_4$ and $N_2O$ for example, $N_2O$ is supplied from the side of the rotation shaft. When depositing a SiC film using $SiH_2Cl_2$ and $C_3H_6$ for example, $C_3H_6$ is supplied from the side of the rotation shaft. When depositing a SiCN film using $SiH_2Cl_2$, $C_3H_6$, and $NH_3$ for example, $C_3H_6$ or $NH_3$ is supplied from the side of the rotation shaft.

The following describes preferred modes of the present invention.

According to one aspect of the present invention, there is provided a substrate processing apparatus including: a reaction container in which a substrate is processed; a seal cap, brought into contact with one end in an opening side of the reaction container via a first sealing member and a second sealing member so as to seal the opening of the reaction container air-tightly; a first gas channel, formed in a region between the first sealing member and the second sealing member in a state where the seal cap is in contact with the reaction container; a second gas channel, provided to the seal cap and through which the first gas channel is in communication with an inside of the reaction container; a first gas supply port that is provided to the reaction container and supplies a first gas to the first gas channel; and a second gas supply port that is provided to the reaction container and supplies a second gas into the reaction container, wherein a front end opening of the first gas supply port opening to the first gas channel, and a base opening of the second gas channel opening to the first gas channel being separated from each other in a state where the seal cap is in contact with the reaction container.

Preferably, a groove provided along the first sealing member and the second sealing member, in at least a portion of at least one of the reaction container and the seal cap in the region between the first sealing member and the second sealing member, in a state where the seal cap is in contact with the reaction container, wherein the first gas channel is defined by the groove Preferably, the groove is a form of an arc or a ring.

Preferably, the groove is provided along an entire periphery of the region between the first sealing member and the second sealing member.

Preferably, the front end opening of the first gas supply port and the base opening of the second gas channel are positioned substantially opposite to each other with respect to the center of the seal cap, in a state where the seal cap is in contact with the reaction container.

Preferably, an arc channel defining the first gas channel between the front end opening of the first gas supply port and the base opening of the second gas channel has a center angle of 90° to 270°.

Preferably, the second gas channel is formed at least partially by a pipe, and wherein the pipe includes a first vertical portion and a second vertical portion, and is separable with the first vertical portion and the second vertical portion.

Preferably, there are provided a support member that supports the substrate; a rotation shaft that is provided through the seal cap and supports and rotates the support member; and a rotation mechanism that is attached to the seal cap and rotates the rotation shaft, wherein the rotation mechanism includes therein a hollow portion that opens to the inside of the reaction container through a space between the rotation shaft and the seal cap, and wherein the second gas channel is formed by the hollow portion, and a pipe through which the first gas channel is in communication with the hollow portion Preferably, the first gas is an $NH_3$ gas or an inert gas, wherein the second gas is a chlorosilane gas.

According to another aspect of the present invention, there is provided a substrate processing apparatus, including: a reaction tube in which a substrate is processed; a manifold having one end connected to an opening of the reaction tube; a seal cap, brought into contact via a first sealing member and a second sealing member with another end of the manifold on the opposite side of the one end connected to the reaction tube, so as to seal air-tightly an opening in the another end of the manifold; a first gas channel, defined by a recessed portion provided along the first sealing member and the second sealing member and in at least a portion of at least one of the manifold and the seal cap in a region between the first sealing member and the second sealing member, in a state where the seal cap is in contact with the manifold; a second gas channel, provided to the seal cap and through which the first gas channel is in communication with an inside of the reaction tube; a first gas supply port that is provided to the manifold and supplies a first gas to the first gas channel; and a second gas supply port that is provided to the manifold and supplies a second gas into the reaction tube, wherein a portion of the first gas supply port opening to the first gas channel, and a portion of the second gas channel opening to the first gas channel being positioned so as not to overlap each other in a state where the seal cap is in contact with the manifold.

According to another aspect of the present invention, there is provided a substrate processing apparatus, including: a reaction container in which a substrate is processed; a seal cap, brought into contact with one end in a opening side of the reaction container via a first sealing member and a second sealing member, so as to seal the opening of the reaction container air-tightly; a first gas channel, defined by an annular recessed portion provided in at least one of the reaction container and the seal cap in a region between the first sealing member and the second sealing member in a state where the seal cap is in contact with the reaction container;

a second gas channel, provided to the seal cap and through which the first gas channel is in communication with an inside of the reaction container; a first gas supply port that is provided to the reaction container and supplies a first gas to the first gas channel; and a second gas supply port that is provided to the reaction container and supplies a second gas into the reaction container, wherein a portion of the first gas supply port opening to the first gas channel, and a portion of the second gas channel opening to the first gas channel being separated from each other in a state where the seal cap is in contact with the reaction container.

According to yet another aspect of the present invention, there is provided a substrate processing apparatus, comprising: a reaction container in which a substrate is processed; a seal cap, brought into contact with one end in an opening side of the reaction container via a first sealing member and a second sealing member, so as to seal the opening of the reaction container air-tightly; a first gas channel, formed in a region between the first sealing member and the second sealing member in a state where the seal cap is in contact with the reaction container; a second gas channel, provided to the seal cap and through which the first gas channel is in communication with an inside of the reaction container; and a gas supply port that is provided to the reaction container and supplies a gas to the first gas channel, wherein a portion of the first gas supply port opening to the first gas channel, and a portion of the second gas channel opening to the first gas channel being separated from each other is a state where the seal cap is in contact with the reaction container.

According to still another aspect of the present invention, there is provided a method of manufacturing a semiconductor device, comprising the steps of: loading a substrate into a reaction container; forming a first gas channel in a region between a first sealing member and a second sealing member, by bringing a seal cap into contact with one end in an opening side of the reaction container via the first sealing member and the second sealing member so as to seal the opening of the reaction container air-tightly; processing the substrate by supplying a first gas to the first gas channel through a first gas supply port provided to the reaction container, and supplying the first gas supplied to the first gas channel into the reaction container through a second gas channel that is provided to the seal cap to connect the first gas channel to the reaction container, and supplying a second gas into the reaction container through a second gas supply port provided to the reaction container; and unloading the processed substrate from the reaction container.

According to yet another aspect of the present invention, there is provided a method of manufacturing a semiconductor device, comprising the steps of: loading a substrate into a reaction container; forming a first gas channel in a region between a first sealing member and a second sealing member, by bringing a seal cap into contact with one end in an opening side of the reaction container via the first sealing member and the second sealing member so as to seal the opening of the reaction container air-tight; processing the substrate by supplying a gas to the first gas channel through a first gas supply port provided to the reaction container, and supplying the gas supplied to the first gas channel into the reaction container through a second gas channel that is provided to the seal cap to connect the first gas channel to the reaction container; and unloading the processed substrate from the reaction container.

INDUSTRIAL APPLICABILITY

The present invention is applicable to substrate processing apparatuses that process substrates such as semiconductor wafers and glass substrates, and semiconductor device manufacturing methods, in which adhesion of by-products needs to be prevented with a simple structure.

The invention claimed is:

1. A method of manufacturing a semiconductor device, comprising:
    loading a substrate into a reaction container;
    forming a first gas channel in a region between a first sealing member and a second sealing member, by bringing a seal cap into contact with one end in an opening side of the reaction container via the first sealing member and the second sealing member so as to seal the opening of the reaction container air-tightly;
    processing the substrate by supplying a first gas to the first gas channel through a first gas supply port provided to the reaction container, and supplying the first gas supplied to the first gas channel into the reaction container through a second gas channel that is provided to the seal cap to connect the first gas channel to the reaction container, and supplying a second gas into the reaction container through a second gas supply port provided to the reaction container; and
    unloading the processed substrate from the reaction container.

2. A method of manufacturing a semiconductor device, comprising:
    loading a substrate into a reaction container;
    forming a first gas channel in a region between a first sealing member and a second sealing member, by bringing a seal cap into contact with one end in an opening side of the reaction container via the first sealing member and the second sealing member so as to seal the opening of the reaction container air-tight;
    processing the substrate by supplying a gas to the first gas channel through a first gas supply port provided to the reaction container, and supplying the gas supplied to the first gas channel into the reaction container through a second gas channel that is provided to the seal cap to connect the first gas channel to the reaction container; and
    unloading the processed substrate from the reaction container.

3. A method of manufacturing a semiconductor device according to claim 1,
wherein a front end opening of the first gas supply port opening to the first gas channel, and a base opening of the second gas channel opening to the first gas channel are separated from each other in a state where the seal cap is in contact with the reaction container.

4. A method of manufacturing a semiconductor device according to claim 1,
a groove being provided along the first sealing member and the second sealing member, in at least a portion of at least one of the reaction container and the seal cap in the region between the first sealing member and the second sealing member, in a state where the seal cap is in contact with the reaction container, wherein the first gas channel is defined by the groove.

5. A method of manufacturing a semiconductor device according to claim 4, wherein the groove is in a form of an arc or a ring.

6. A method of manufacturing a semiconductor device according to claim 4, wherein the groove is provided along the entire periphery of the region between the first sealing member and the second sealing member.

7. A method of manufacturing a semiconductor device according to claim 1, wherein the front end opening of the first gas supply port and the base opening of the second gas channel are positioned substantially opposite to each other with respect to the center of the seal cap, in a state where the seal cap is in contact with the reaction container.

8. A method of manufacturing a semiconductor device according to claim 1, wherein an arc channel defining the first gas channel between the front end opening of the first gas supply port and the base opening of the second gas channel has a center angle of 90° to 270°.

9. A method of manufacturing a semiconductor device according to claim 1, wherein the second gas channel is formed at least partially by a pipe, and wherein the pipe includes a first vertical portion and a second vertical portion, and is separable with the first vertical portion and the second vertical portion.

10. A method of manufacturing a semiconductor device according to claim 1, further comprising: utilizing a substrate processing apparatus, the apparatus comprising:
a support member that supports the substrate;
a rotation shaft that is provided through the seal cap and supports and rotates the support member; and
a rotation mechanism that is attached to the seal cap and rotates the rotation shaft,
wherein the rotation mechanism includes therein a hollow portion that opens to the inside of the reaction container through a space between the rotation shaft and the seal cap, and wherein the second gas channel is formed by the hollow portion, and a pipe through which the first gas channel is in communication with the hollow portion.

11. A method of manufacturing a semiconductor device according to claim 1, wherein the first gas is an $NH_3$ gas or an inert gas, and wherein the second gas is a chlorosilane gas.

12. A method of manufacturing a semiconductor device, comprising:
loading a substrate into a reaction container, the reaction container comprising:
a reaction tube; and
a manifold having one end connected to an opening of the reaction tube;
forming a first gas channel in a region between a first sealing member and a second sealing member, by bringing a seal cap into contact with another end of the manifold on the opposite side of the one end connected to the reaction tube via the first sealing member and the second sealing member so as to seal air-tightly an opening in the another end of the manifold;
processing the substrate by supplying a first gas to the first gas channel through a first gas supply port provided to the manifold, and supplying the first gas supplied to the first gas channel into the reaction container through a second gas channel that is provided to the seal cap to connect the first gas channel to the reaction container, and supplying a second gas into the reaction container through a second gas supply port provided to the manifold; and
unloading the processed substrate from the reaction container.

* * * * *